United States Patent
Kim et al.

(10) Patent No.: US 9,991,459 B2
(45) Date of Patent: Jun. 5, 2018

(54) ORGANIC LIGHT EMITTING DIODE

(71) Applicant: SAMSUNG DISPLAY CO., LTD., Yongin-si, Gyeonggi-do (KR)

(72) Inventors: Myunghwan Kim, Seongnam-si (KR); Minho Park, Kyungbuk (KR); Wonjun Song, Hwaseong-si (KR); Taewoo Lee, Kyungbuk (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 8 days.

(21) Appl. No.: 15/191,947

(22) Filed: Jun. 24, 2016

(65) Prior Publication Data

US 2017/0133616 A1    May 11, 2017

(30) Foreign Application Priority Data

Nov. 6, 2015    (KR) .................. 10-2015-0155942

(51) Int. Cl.
   *H01L 51/50*    (2006.01)
   *H01L 51/52*    (2006.01)

(52) U.S. Cl.
   CPC ........ *H01L 51/504* (2013.01); *H01L 51/5206* (2013.01); *H01L 51/5218* (2013.01); *H01L 51/5221* (2013.01); *H01L 51/5234* (2013.01); *H01L 2251/303* (2013.01)

(58) Field of Classification Search
   CPC .................................................. H01L 51/504
   See application file for complete search history.

(56) References Cited

U.S. PATENT DOCUMENTS

| | | | |
|---|---|---|---|
| 2011/0037481 A1 | 2/2011 | Kim | |
| 2013/0240847 A1 | 9/2013 | Zakhidov et al. | |
| 2015/0155513 A1* | 6/2015 | Pieh | H01L 27/3209 257/40 |
| 2015/0270505 A1* | 9/2015 | Seo | H01L 51/5016 257/40 |
| 2016/0343776 A1* | 11/2016 | Heo | H01L 27/322 |

FOREIGN PATENT DOCUMENTS

| | | |
|---|---|---|
| KR | 10-2014-0077019 A | 6/2014 |
| KR | 10-1539842 B1 | 7/2015 |

* cited by examiner

*Primary Examiner* — Daniel Whalen
*Assistant Examiner* — Suberr Chi
(74) *Attorney, Agent, or Firm* — Lee & Morse, P.C.

(57) ABSTRACT

An organic light emitting diode, including a first electrode; a first light emitting unit on the first electrode; a charge generating layer on the first light emitting unit, the charge generating layer including a plurality of organic layers; a second light emitting unit on the charge generating layer; and a second electrode on the second light emitting unit, the plurality of organic layers of the charge generating layer including a first organic layer and a second organic layer that are respectively adjacent to the first light emitting unit and the second light emitting unit; and a third organic layer between the first organic layer and the second organic layer, the first organic layer and the second organic layer being one of a p-type layer or a hole transport layer, and the third organic layer being the other of the p-type layer or the hole transport layer.

17 Claims, 6 Drawing Sheets

ORGANIC LIGHT EMITTING DIODE

CROSS-REFERENCE TO RELATED APPLICATION

Korean Patent Application No. 10-2015-0155942, filed on Nov. 6, 2015, in the Korean Intellectual Property Office, and entitled: "Organic Light Emitting Diode," is incorporated by reference herein in its entirety.

BACKGROUND

1. Field

The present disclosure herein relates to an organic light emitting diode.

2. Description of the Related Art

An organic light emitting diode may be a self-light emitting type diode having a wide viewing angle and superb contrast. An organic light emitting diode may exhibit a fast response time, a high brightness, and a low drive voltage.

SUMMARY

Embodiments may be realized by providing an organic light emitting diode, including a first electrode; a first light emitting unit on the first electrode; a charge generating layer on the first light emitting unit, the charge generating layer including a plurality of organic layers; a second light emitting unit on the charge generating layer; and a second electrode on the second light emitting unit, the plurality of organic layers of the charge generating layer including a first organic layer and a second organic layer that are respectively adjacent to the first light emitting unit and the second light emitting unit; and a third organic layer between the first organic layer and the second organic layer, the first organic layer and the second organic layer both being one of a p-type layer or a hole transport layer, and the third organic layer being the other of the p-type layer or the hole transport layer.

The first organic layer and the second organic layer may both be p-type layers, and the third organic layer may be the hole transport layer.

The charge generating layer may further include one or more n-type layers, and the one or more n-type layers may be between the first organic layer and the first light emitting unit, or between the second organic layer and the second light emitting unit.

The first light emitting unit may include a first hole controller on the first electrode, a first light emitter on the first hole controller, and a first electron controller on the first light emitter; and the second light emitting unit may include a second electron controller on the charge generating layer, a second light emitter on the second electron controller, and a second hole controller on the second light emitter.

The first hole controller or the second hole controller may include a hole transporter and a hole injector.

The hole transporting layer and the hole transporter may include a same hole transport material.

The first light emitter and the second light emitter may emit light have different wavelengths from each other.

One or more of the first light emitter or the second light emitter may include a plurality of light emitting layers.

The first organic layer and the second organic layer may both be hole transport layers, and the third organic layer may be the p-type layer.

The charge generating layer may further include a fourth organic layer which is the p-type layer, and a fifth organic layer which is an n-type layer.

The fifth organic layer may be a middle layer of the charge generating layer; the third organic layer may be between the fifth organic layer and the first organic layer; and the fourth organic layer may be between the fifth organic layer and the second organic layer.

The first light emitting unit may include a first electron controller on the first electrode, and a first light emitter on the first electron controller; and the second light emitting unit may include a second light emitter on the charge generating layer, and a second electron controller on the second light emitter.

The first light emitting unit may further include a first hole controller on the first light emitter.

The second light emitting unit may further include a second hole controller between the charge generating layer and the second light emitter.

The first hole controller and the second hole controller may be hole transporters.

The first light emitter and the second light emitter may emit light have different wavelengths from each other.

The p-type layer may include a transition metal oxide, and the transition metal oxide may be one or more of vanadium (V) oxide ($V_2O_5$), tungsten(VI) oxide ($WO_3$), molybdenum (VI) oxide ($MoO_3$), rhenium(VI) oxide ($ReO_3$), iron(II,III) oxide ($Fe_3O_4$), manganese(IV) oxide ($MnO_2$), cobalt(IV) oxide ($CoO_2$), or titanium(IV) oxide ($TiO_2$).

A first bias may be applied to the first electrode, and a second bias which is different from the first bias may be applied to the second electrode; and one of the first light emitting unit or the second light emitting unit may emit light.

One of the first electrode or the second electrode may be a reflective electrode.

The first electrode and the second electrode may be transparent electrodes or semi-transparent electrodes.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
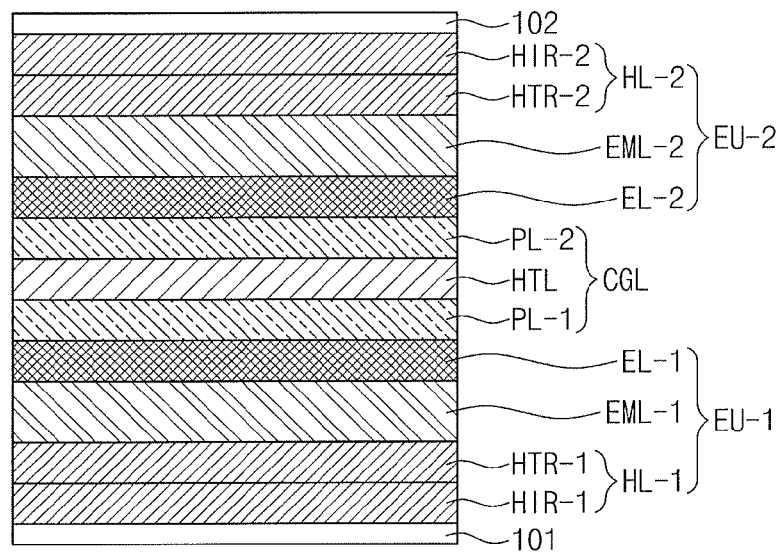
FIGS. 1 to 4 illustrate cross-sectional views of an organic light emitting diode according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In describing the figures, like reference numerals were used to refer to like elements. In the accompanying drawings, the dimensions of the elements may be exaggerated for effective description of the technical contents. It will be understood that, although the terms first, second, etc., may be used herein to describe various elements, these elements should not be limited by these terms. These terms are only used to distinguish one element form another element. For example, a first element could be termed a second element. Singular forms are intended to include the plural forms as well, unless the context clearly indicates otherwise.

It will be understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. Moreover, it will be understood that when a part such as a layer, a film, an area, a plate, etc., is referred to as being "on" another part, it can be "directly on" the other part, or intervening parts may be present. In addition, when a part such as a layer, a film, an area, a plate, etc., is referred to as being "below" another part, it can be "directly below" the other part, or intervening parts may be present.

Hereinafter, with reference to the drawings, description is given of an organic light emitting diode according to an embodiment.

FIG. 1 illustrates a cross-sectional view of an organic light emitting diode according to an embodiment. The organic light emitting diode according to an embodiment may be a laminated type organic light emitting diode, which may be laminated in sequence. Referring to the figure, the organic light emitting diode may include a first electrode 101, a first light emitting unit EU-1 disposed on the first electrode 101, a charge generating layer CGL disposed on the first light emitting unit EU-1, a second light emitting unit EU-2 disposed on the charge generating layer CGL, and a second electrode 102 disposed on the second light emitting unit EU-2. For example, the organic light emitting diode may be configured such that the first electrode 101 and the second electrode 102 are disposed to face each other, and the first light emitting unit EU-1, the charge generating layer CGL, and the second light emitting unit EU-2 are laminated in sequence between the first electrode 101 and the second electrode 102.

The first electrode 101 or the second electrode 102 may be formed of a metal alloy or a conductive compound. The first electrode 101 or the second electrode 102 may be a transmissive electrode, a semi-transmissive electrode, or a reflective electrode. When the first electrode 101 or the second electrode 102 is a transmissive electrode, the first electrode 101 or the second electrode 102 may include, e.g., consist of, for example, indium tin oxide (ITO), indium zinc oxide (IZO), zinc oxide (ZnO), or indium tin zinc oxide (ITZO).

The first electrode 101 or the second electrode 102 may be a semi-transmissive electrode or a reflective electrode. The first electrode 101 or the second electrode 102 may be formed to include silver (Ag), magnesium (Mg), aluminum (Al), platinum (Pt), palladium (Pd), gold (Au), nickel (Ni), neodymium (Nd), iridium (Ir), or (Cr), or mixtures thereof. The first electrode 101 or the second electrode 102 may be a layer that includes a compound of, for example, lithium (Li), calcium (Ca), lithium fluoride/calcium (LiF/Ca), lithium fluoride/aluminum (LiF/Al), barium fluoride (BaF), barium (Ba), silver/magnesium (Ag/Mg), or mixtures thereof.

In the organic light emitting diode of an embodiment, according to the mode of operation, the first electrode 101 and the second electrode 102 may be anodes, which may inject holes. In an embodiment, the first electrode 101 and the second electrode 102 may be cathodes, which may inject electrons.

For example, in the embodiment illustrated in FIG. 1, the first electrode 101 and the second electrode 102 may be anodes.

The first electrode 101 or the second electrode 102 may be formed as a plurality of layers. The first electrode 101 or the second electrode 102 may be provided through, for example, a sputtering method or a vacuum deposition method. Each of the first electrode 101 or the second electrode 102 may be formed to a thickness of about 30 nm to about 300 nm.

As illustrated in FIG. 1, when, for example, the first electrode 101 is a transparent electrode and the second electrode 102 is a reflective electrode, the organic light emitting diode may be a bottom emission type. When both of the first electrode 101 and the second electrode 102 are transparent electrodes, the organic light emitting diode may be a dual emission type configured to emit light to both of the first electrode side and the second electrode side, and when the first electrode 101 is a reflective electrode and the second electrode 102 is a transparent electrode, the organic light emitting diode may be a top emission type.

The first electrode 101 and the second electrode 102 may be connected to an external power source. Due to, for example, the difference in the voltage applied by the power source to each of the electrodes in the organic light emitting diode, a forward bias in a direction from the first electrode 101 to the second electrode 102 may be applied, or a reverse bias in a direction from the second electrode 102 to the first electrode 101 may be applied. Description of the operation of the organic light emitting diode according to the direction in which the bias is applied will be given again later.

The charge generating layer CGL may be disposed between the first electrode 101 and the second electrode 102. The charge generating layer CGL may include a plurality of organic layers. In FIG. 1, the charge generating layer CGL may be a structure in which a first organic layer PL-1 disposed adjacent to the first light emitting unit EU-1, a second organic layer PL-2 disposed adjacent to the second light emitting unit EU-2, and a third organic layer HTL disposed between the first organic layer PL-1 and the second organic layer PL-2 are laminated.

In FIG. 1, the first organic layer PL-1 and the second organic layer PL-2 may be p-type layers, and the third organic layer HTL disposed between the first organic layer PL-1 and the second organic layer PL-2 may be a hole transport layer. For example, in FIG. 1, the charge generating layer CGL may have a structure in which the p-type layer, the hole transport layer, and the p-type layer are laminated in sequence, and the charge generating layer CGL may be provided as a symmetrical structure in which the p-type layers are respectively laminated to both of the sides with respect to the hole transport layer, which is in the middle.

The first organic layer and the second organic layer PL-1 and PL-2 may be p-type organic layers. The first organic layer and the second organic layer PL-1 and PL-2 may be layers composed of a transition metal oxide or composed of a material doped with a p-type dopant.

The transition metal forming the p-type layers may be one or more of vanadium(V) oxide ($V_2O_5$), tungsten(VI) oxide ($WO_3$), molybdenum(VI) oxide ($MoO_3$), rhenium(VI) oxide ($ReO_3$), iron(II,III) oxide ($Fe_3O_4$), manganese(IV) oxide ($MnO_2$), cobalt(IV) oxide ($CoO_2$), or titanium(IV) oxide ($TiO_2$). For example, in an embodiment, the first organic layer PL-1 or the second organic layer PL-2 may be a layer formed to include the transition metal oxide, $MoO_3$.

The first organic layer and the second organic layer PL-1 and PL-2 of p-type layers formed using the transition metal oxide may be provided to a thickness of about 1 nm to about 10 nm. When the thickness of the p-type layer is less than about 1 nm, an electrical short circuit may occur, and the efficiency in generating electrons and holes may be reduced. When formed thicker than about 10 nm, the light emitting efficiency of the diode may be reduced due to, for example, the effect of the thickness of the organic layer.

The third organic layer HTL, hole transport layer may be provided to include a hole transport material, and, for example, 4,4',4''-tris(n-carbazolyl)triphenylamine (TCTA), 4,4'-cyclohexylidene bis[n,n-bis(4-methylphenyl)benzenamine] (TAPC), or n,n'-bis(3-methylphenyl)-n,n'-diphenyl-[1,1-biphenyl]-4,4'-diamine (TPD) may be used as the hole transport material. The hole transport layer may be provided to be about 5 nm to about 20 nm. When the thickness of the hole transport layer is less than about 5 nm, an electrical short circuit may occur, or the efficiency in generating electrons and holes may be reduced. In comparison, when the thickness of the hole transport layer is greater than about 20 nm, the light emitting efficiency of the light emitted from the organic diode in a particular direction may be reduced due to, for example, the effect of the thickness of the organic layer. The hole transport layer in the charge generating layer CGL may also be formed of the same material as a hole transporter in the below-described light emitting unit.

The charge generating layer CGL may perform the role of transporting holes or electrons to the light emitting units EU-1 and EU-2 disposed on both of the sides. For example, the charge generating layer CGL may perform the function of supplying electrons or supplying holes to the light emitting units.

In the interface between the first organic layer and the second organic layer PL-1 and PL-2 and the third organic layer HTL in the charge generating layer CGL, a separation of the holes and the electrons may occur due to, for example, a difference in the energy level. For example, when the first electrode 101 has a higher voltage than the second electrode 102, the current may flow in the forward direction from the first electrode 101 to the second electrode 102, and in the charge generating layer CGL, electrons may be provided to the side of the first light emitting unit EU-1.

When the forward bias is applied to the organic light emitting diode, in the charge generating layer CGL, the p-type layer that corresponds to the first organic layer PL-1 may have a higher voltage level than the hole transport layer that corresponds to the third organic layer HTL, which is the middle layer. A separation of the holes and electrons may occur in the interface between the p-type layer, which is the first organic layer PL-1, and the hole transport layer, and the electrons may be transported to the first light emitting unit EU-1.

When the forward bias is applied, the hole transport layer that corresponds to the third organic layer HTL may have the higher voltage level between the p-type layer that corresponds to the second organic layer PL-2, and the third organic layer HTL. A separation effect of the holes and electrons may not occur in the interface between the p-type layer, which is the second organic layer PL-2, and the hole transport layer, and the transport of electrons to the side of the second light emitting unit EU-2 may not be realized. When the forward bias from the first electrode 101 to the second electrode 102 is applied, the first light emitting unit EU-1 may operate, and the second light emitting unit EU-2 may not operate.

When the reverse bias by which current flows from the second electrode 102 to the first electrode 101 is applied, due to, for example, the same above-described mechanism, the second light emitting unit EU-2 may operate and the first light emitting unit EU-1 may not operate. For example, when the second electrode 102 has a higher voltage level than the first electrode 101, the current may flow from the second electrode 102 toward the first electrode 101, and in the charge generating layer CGL, charge may be supplied to the side of the second light emitting unit EU-2.

For example, in the charge generating layer, the p-type layer that corresponds to the second organic layer PL-2 may have a higher voltage level than the hole transport layer that corresponds to the third organic layer HTL, which is the middle layer, a separation of the electrons and holes may occur in the interface between the p-type layer, which is the second organic layer PL-2, and the hole transport layer, and the electrons may be transported to the second light emitting unit EU-2.

When the reverse bias is applied, the hole transport layer, which is the third organic layer HTL, may have the higher voltage level between the p-type layer that corresponds to the first organic layer PL-1, and the hole transport layer, a separation effect of the holes and electrons may not occur in the interface between the p-type layer, which is the first organic layer PL-1, and the hole transport layer, which is the third organic layer HTL, and the transport of electrons to the side of the first light emitting unit EU-1 may not be realized. When the reverse bias from the second electrode 102 toward the first electrode 101 is applied, the second light emitting unit EU-2 may operate, and the first light emitting unit EU-1 may not operate.

Each of the first light emitting unit EU-1 or the second light emitting unit EU-2 may be formed to include a hole controller HL-1 and HL-2, a light emitter EML-1 and EML-2, and an electron controller EL-1 and EL-2. Referring to FIG. 1, the first light emitting unit EU-1 may be a structure in which, with respect to the first electrode 101, a first hole controller HL-1, a first light emitter EML-1, and a first electron controller EL-1 are laminated in sequence.

The second light emitting unit EU-2 may be a structure in which, starting from the charge generating layer CGL, a second electron controller EL-2, a second light emitter EML-2, and a second hole controller HL-2 are laminated in sequence. For example, the first light emitting unit EU-1 and the second light emitting unit EU-2 may be provided symmetrically such that layers having identical functions may be disposed on both of the sides with respect to the charge generating layer CGL. In a symmetrical structure, layers having identical functions may be disposed so as to be symmetrical on both of the sides with respect to the charge generating layer CGL, and each of the symmetrical layers in the first light emitting unit EU-1 and the second light emitting unit EU-2 may not be composed of the same materials or have the same thickness values.

Hereinafter, description is given of the first hole controller HL-1, the first light emitter EML-1, and the first electron controller EL-1, which may be included in the first light emitting unit EU-1. Description of the second hole controller HL-2, the second light emitter EML-2, and the second electron controller EL-2, which may be included in the second light emitting unit EU-2, is excluded for parts identical to the description of the first light emitting unit, and only the differences are described.

The first hole controller HL-1 may include a hole injector HIR-1 and a hole transporter HTR-1, and be composed of a plurality of layers. The first hole controller HL-1 may further include one or more of a hole buffer layer or an electron blocking layer.

The first hole controller HL-1 may have a structure of a single layer composed of a single material, a single layer composed of a plurality of materials that may be different from each other, or a plurality of layers formed of materials that may be different from each other.

For example, the first hole controller HL-1 may have a structure of a single layer composed of materials that may be different from each other, or a structure of the hole injector/hole transporter, hole injector/hole transporter/hole buffer layer, hole injector/hole buffer layer, hole transporter/hole buffer layer, or hole injector/hole transporter/electron blocking layer laminated in sequence.

The first hole controller HL-1 may be foiined through various methods such as, for example, a vacuum deposition method, a spin coating method, a casting method, a Langmuir-Blodgett (LB) method, an inkjet printing method, a laser printing method, or a laser induced thermal imaging (LITI) method.

When the first hole controller HL-1 includes the hole injector HIR-1, the first hole controller HL-1 may include, for example, a phthalocyanine compound such as copper phthalocyanine, or include n,d-diphenyl-n,d-bis-[4-(phenyl-m-tolyl-amino)-phenyl]-biphenyl-4,4'-diamine (DNTPD), 4,4',4''-tris(3-methylphenylphenylamino) triphenylamine (m-MTDATA), 4,4'4''-tris(n,n-diphenylamino)triphenylamine (TDATA), 4,4',4''-tris{n,-(2-naphthyl)-n-phenylamino}-triphenylamine (2TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonicacid (PANI/CSA), or (polyaniline)/poly(4-styrenesulfonate) (PANI/PSS).

When the first hole controller HL-1 includes the hole transporter HTR-1, the first hole controller HL-1 may include, for example, a carbazole-based derivative such as n-phenylcarbazole or polyvinylcarbazole, a fluorine-based derivative, a triphenylamine-based derivative such as n,n'-bis(3-methylphenyl)-n,n'-diphenyl-[1,1-biphenyl]-4,4'-diamine(TPD) or 4,4',4''-tris(n-carbazolyl)triphenylamine (TCTA), or include n,n'-di(1-naphthyl)-n,n'-diphenylbenzidine (NPB) or 4,4'-cyclohexylidene bis[n,n-bis(4-methylphenyl)benzenamine] (TAPC).

The thickness of the hole injector HIR-1 in the first hole controller HL-1 may be, for example, about 1 nm to about 100 nm. The thickness of the hole transporter HTR-1 may be, for example, about 5 nm to about 100 nm. When the thicknesses of the hole injector HIR-1 and the hole transporter HTR-1 in the first hole controller HL-1 satisfy such above-described ranges, a satisfactory level of the hole transporting property may be realized without a substantial increase in the drive voltage.

The first hole controller HL-1 may further include, other than the materials exemplarily mentioned above, a charge generating material for improving the electrical conductivity. The charge generating material may be uniformly or non-uniformly distributed in the first hole controller HL-1. The charge generating material may be, for example, a p-type dopant. The p-type dopant may be one of, for example, a quinone derivative, a metal oxide, or a cyano group-containing compound. For example, an example of the p-type dopant may include a quinone derivative such as tetracyanoquinodimethane (TCNQ) or 2,3,5,6-tetrafluoro-tetracyanoquinodimethane (F4-TCNQ), or a metal oxide such as tungsten oxide or molybdenum oxide.

In the first light emitting unit EU-1, the first light emitter EML-1 may be disposed on the first hole controller HL-1. The first light emitter EML-1 may be composed of a single layer or a plurality of at least two layers. The first light emitter EML-1 may be formed to include at least one host material and at least one dopant material. The dopant in the light emitter may be, for example, a red, green, or blue colored dopant.

Fac-tris(2-phenyl)-bis(2-(2'-benzothienyl)-pyridinatoN, C')(acetylacetonate)Ir(III) (Bt$_2$Ir(acac)) or tris[1-phenylisoquinoline-C2,N]iridium(III) (Ir(piq)$_3$), for example, may be used as the red dopant. Iridium, tris[2-(2-pyridinyl-κN) phenyl-κC] (Ir(ppy)$_3$), bis[2-(2-pyridinyl-N)phenyl-C] (acetylacetonato)iridium(III) (Ir(ppy)$_2$(acac)), or tris[2-(p-tolyl)pyridine]iridium(III) (Ir(mppy)$_3$), for example, may be used as the green dopant, and bis((4,6-difluorophenyl)-pyridinatoN,C)(picolinato)Ir(III)(FIrpic) or 4,4'-bis(2,2'-diphenylvinyl)-1,1'-biphenyl (DPAVBi), for example, may be used as the blue dopant.

4,4',n,n'-dicarbazole-biphenyl (CBP), n,n-dicarbazolyl-3,5-benzene (mCP), 4,4',4''-tris(n-carbazolyl)triphenylamine (TCTA), 1,3,5-tri(1-phenyl-1h-benzo[d]imidazol-2-yl)phenyl (TPBI), or tris(8-hydroxyquinolinato)aluminum (Alq3), for example, may be used as the host material in the light emitter. The light emitter may be provided to a thickness of about 5 nm to about 100 nm.

The first electron controller EL-1 may be disposed on the first light emitter EML-1. When the first electron controller EL-1 includes the electron transport layer, the first electron controller EL-1 may include, for example, tris(8-hydroxyquinolinato)aluminum (Alq3), 1,3,5-tri(1-phenyl-1h-benzo [d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4h-1,2,4-triazole (NTAZ), 2-(4-biphenylyl)-5-(4-tert-butylphenyl)-1,3,4-oxadiazole (tBu-PBD), bis(2-methyl-8-quinolinolato-n1,o8)-(1,1'-biphenyl-4-olato) aluminum (BAlq), berylliumbis(benzoquinolin-10-olate) (Bebq2), or 9,10-di(naphthalene-2-yl)anthracene (ADN), or derivatives thereof.

The thickness of the first electron controller EL-1 may be about 10 nm to about 100 nm or, for example, about 45 nm to about 55 nm. When the thickness of the first electron controller EL-1 satisfies such an above-described range, a satisfactory level of the electron transporting property may be realized without a substantial increase in the drive voltage.

When the first electron controller EL-1 includes the electron injection layer, lithium fluoride (LiF), lithium quinolate (LiQ), lithium oxide (Li$_2$O), barium oxide (BaO), sodium chloride (NaCl), cesium fluoride (CsF), a lanthanide metal such as ytterbium (Yb), or a metal halide such as rubidium chloride (RbCl) or rubidium iodide (RbI), for example, may be used in the first electron controller EL-1. The first electron controller EL-1 may also be formed of a material in which an electron transport material is mixed with an insulating organo metal salt. The organo metal salt may be a material having an energy band gap larger than about 4 eV. For example, the organo metal salt may include metal acetate, metal benzoate, metal acetoacetate, metal acetylacetonate, or metal stearate.

As described above, the first electron controller EL-1 may include a hole blocking layer. The hole blocking layer may include, for example, one or more of 2,9-dimethyl-4,7-diphenyl-1,10-phenanthroline (BCP) or 4,7-diphenyl-1,10-phenanthroline (Bphen).

The second light emitting unit EU-2 may be provided by laminating the second electron controller EL-2, the second light emitter EML-2, and the second hole controller HL-2 in sequence with respect to the charge generating layer CGL. The second hole controller HL-2, the second light emitter EML-2, and the second electron controller EL-2 included in the second light emitting unit EU-2 may be described using the descriptions of the first hole controller HL-1, the first light emitter EML-1, and the first electron controller EL-1 of the above-described first light emitting unit EU-1.

In an embodiment, the first hole controller HL-1 and the second hole controller HL-2 may be formed of different hole control materials from each other, or have different lamination structures from each other. When the organic light emitting diode is the bottom emission type, the second hole controller HL-2 may be provided to a thickness which may be thinner than the first hole controller HL-1 in order to increase the luminous efficacy of the organic light emitting diode.

The second electron controller EL-2 may be composed the same as the first electron controller EL-1. In an embodiment, the second electron controller EL-2 may be formed of a different electron transport material than the first electron controller EL-1, or the second electron controller EL-2 and the first electron controller EL-1 may have different lamination structures from each other. When, for example, the organic light emitting diode is the bottom emission type, the second electron controller EL-2 may be provided to a thickness which may be thinner than the first electron controller EL-1 in order to increase the luminous efficacy of the organic light emitting diode.

The second light emitter EML-2 may be formed as a single layer or a plurality of at least two layers. The second light emitter EML-2 may be formed to include at least one host material and at least one dopant material. The dopant in the light emitter EML-2 may be a red, a green, or a blue colored dopant. The first light emitter EML-1 and the second light emitter EML-2 may be layers that are doped with dopant materials of different colors from each other, and the first light emitter EML-1 and the second light emitter EML-2 may emit light which is in a different wavelength range from each other.

Due to, for example, the structural properties of the charge generating layer CGL of the above-described embodiment, the light emitted when the forward bias is applied between the first electrode 101 and the second electrode 102 may be in a different wavelength range than the light emitted when the reverse bias is applied. For example, when the first light emitter EML-1 is the layer doped with the green dopant and the second light emitter EML-2 is the layer doped with the red dopant, when the forward bias is applied, the organic light emitting diode may emit the green light.

When the reverse bias is applied, the organic light emitting diode may emit the red light. In an embodiment, the first light emitter EML-1 and the second light emitter EML-2 may emit the same color of light according to the material included therein, and may also emit light having a different color from those exemplarily listed.

In the organic light emitting diode according to an embodiment, the charge generating layer CGL may be disposed between the first light emitting unit EU-1 and the second light emitting unit EU-2 such that the first light emitting unit EU-1 or the second light emitting unit EU-2 may be operated according to the direction of the applied bias to enable a color conversion. The charge generating layer CGL may be a structure in which the p-type layers may be disposed symmetrically to both of the sides with respect to the hole transport layer. The lamination structure of the first light emitting unit EU-1 and the second light emitting unit EU-2 may be symmetrical with respect to the charge generating layer.

Figure 2:
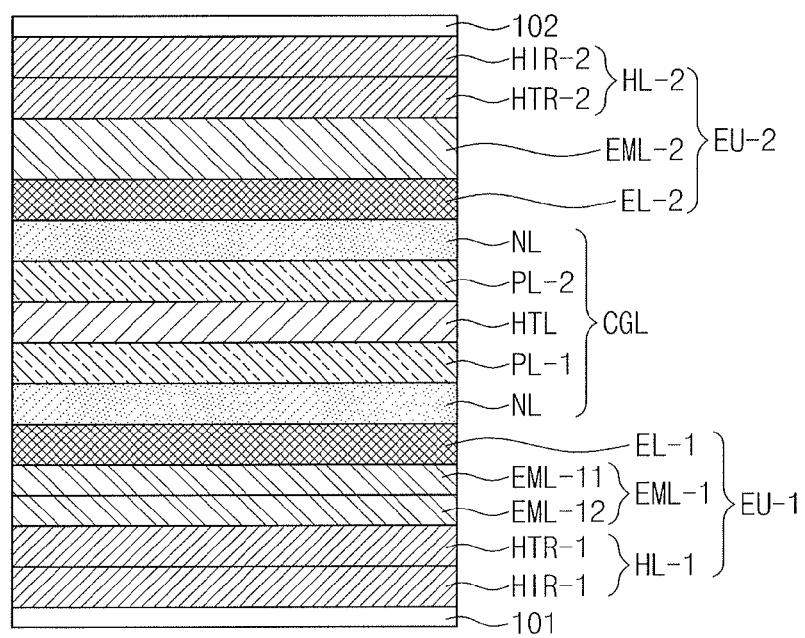
Figure 3:
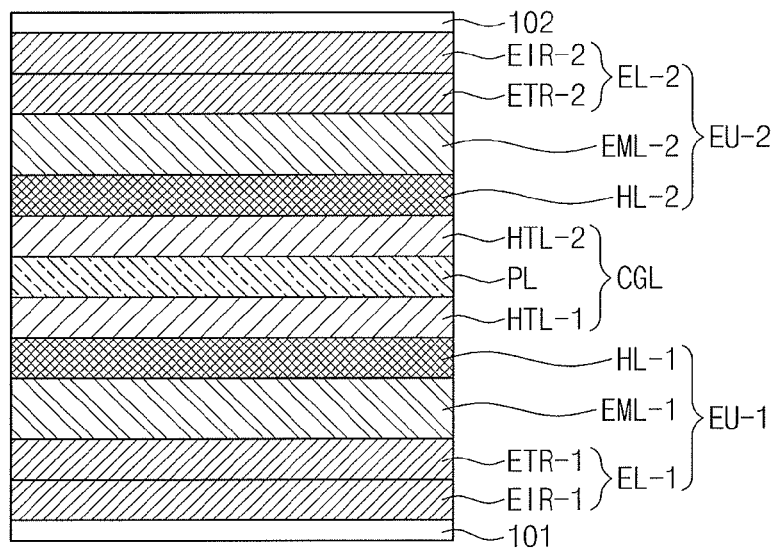
Figure 4:
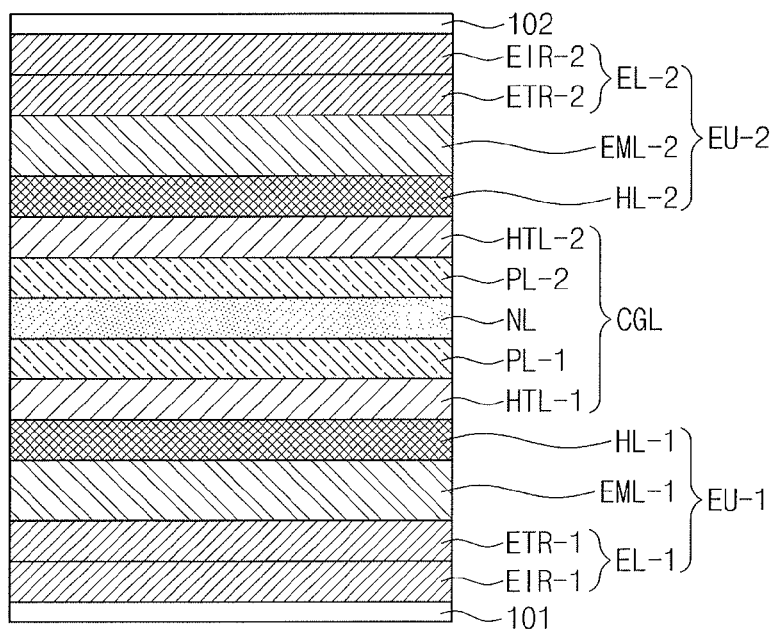

FIGS. 2 to 4 illustrate cross-sectional views of the organic light emitting diode according to an embodiment. In the following descriptions of FIGS. 2 to 4, duplicate descriptions with respect to FIG. 1 are not repeated, and only the differences are described.

FIG. 2 illustrates a cross-sectional view of the organic light emitting diode according to an embodiment. When compared to FIG. 1, an embodiment of the organic light emitting diode in FIG. 2 may further include at least one n-type layer NL in the charge generating layer CGL. The n-type layer NL may be disposed between the first light emitting unit EU-1 and the first organic layer PL-1, and/or between the second light emitting unit EU-2 and the second organic layer PL-2. FIG. 2 illustrates a case in which the n-type layer NL is included on both sides of the charge generating layer CGL, which is adjacent to the first light emitting unit EU-1 and the second light emitting unit EU-2.

For example, the n-type layer NL may be disposed symmetrically with respect to the hole transport layer HTL, which is the middle layer in the charge generating layer CGL, and adjacent to the first light emitting unit EU-1 and the second light emitting unit EU-2, respectively. For example, the charge generating layer in FIG. 2 may be a structure in which the n-type layer NL, the p-type layer that corresponds to the first organic layer PL-1, the hole transport layer HTL, the p-type layer that correspond to the second organic layer PL-2, and the n-type layer NL are laminated in sequence to form the plurality of organic layers.

The n-type layer NL may include at least one host material and at least one n-type dopant. A nitrate-based compound, a carbonate-based compound, a phosphate-based compound, or a quinolate-based compound of an alkali metal and an alkaline earth metal may be used as the n-type dopant material. For example, one of lithium carbonate ($Li_2CO_3$), lithium quinolate (Liq), lithium azide ($LiN_3$), rubidium carbonate ($Rb_2CO_3$), silver nitrate ($AgNO_3$), barium nitrate ($Ba(NO_3)_2$), manganese nitrate ($Mn(NO_3)_2$), zinc nitrate ($Zn(NO_3)_2$), cesium nitrate ($CsNO_3$), cesium carbonate ($Cs_2CO_3$), cesium fluoride (CsF), or cesium azide ($CsN_3$) may be used as the n-type dopant material.

The n-type layer NL included in the charge generating layer CGL may enable an easy, e.g., a relatively easier, transport of electrons from the charge generating layer CGL to the first light emitting unit EU-1 or the second light emitting unit EU-2, and by performing the function of transporting the generated electrons to the first light emitting unit EU-1 or the second light emitting unit EU-2 according to the mode of operation of the organic light emitting diode, the n-type layer NL may increase the efficiency of the organic light emitting diode. When, as in the embodiment of FIG. 2, the n-type layer is further included in the charge generating layer CGL, the electron controller EL-1 and EL-2 may also be excluded from the first light emitting unit EU-1 and the second light emitting unit EU-2.

In the organic light emitting diode according to the embodiment illustrated in FIG. 2, the charge generating layer CGL may be provided so that both of the sides are symmetrical with respect to the hole transport layer HTL. For example, by having the symmetrical structure of the n-type layer NL/p-type layer that corresponds to the first organic layer PL-1/hole transport layer HTL/p-type layer that corresponds to the second organic layer PL-2/n-type layer NL, the charge generating layer CGL may enable the first light emitting unit EU-1 or the second light emitting unit EU-2 to be selectively operated according to the direction in which the bias is applied, and the organic light emitting diode which may be capable of an easy, e.g., a relatively easier, color conversion due to, for example, the structural properties of the charge generating layer CGL, may be provided.

In the embodiment in FIG. 2, the first light emitter EML-1 in the first light emitting unit EU-1 may include a plurality of light emitting layers. For example, the first light emitting unit EU-1 may include two of the light emitting layers EML-11 and EML-12. The two of the light emitting layers EML-11 and EML-12 may be light emitting layers that emit colors in the same wavelength length. For example, by using the host materials that are different from each other, and the same light emitting dopant in the two of the light emitting layers, the light having the same color may be emitted.

In an embodiment, the first light emitter EML-1 may be formed of a plurality of layers that emit light having different wavelengths from each other. For example, two of the light emitting layers EML-11 and EML-12 may be provided to include different dopants from each other. Some of the plurality of light emitting layers in the first light emitter EML-1 may be excluded, or may be provided as the single light emitting layer.

The organic light emitting diode according to the embodiment illustrated in FIG. 3 may include the first electrode 101 and the second electrode 102 that are disposed to face each other, and may include the first light emitting unit EU-1 disposed on the first electrode 101, the charge generating layer CGL disposed on the first light emitting unit EU-1, and the second light emitting unit EU-2 disposed on the charge generating layer CGL.

The charge generating layer CGL in the embodiment illustrated in FIG. 3 may include the plurality of organic layers. The first organic layer adjacent to the first light emitting unit EU-1 and the second organic layer adjacent to the second light emitting unit EU-2 may respectively be the hole transport layers HTL-1 and HTL-2, and the third organic layer disposed between the first organic layer and the second organic layer may be the p-type layer PL, and the charge generating layer CGL may have a structure in which hole transport layer HTL-1, the p-type layer PL, and the hole transport layer HTL-2 are laminated in sequence.

In the embodiment in FIG. 3, the first light emitting unit EU-1 disposed between the first electrode 101 and the charge generating layer CGL may have a structure in which, starting from near the first electrode 101, the first electron controller EL-1, the first light emitter EML-1, and the first hole controller HL-1 are laminated in sequence. The second light emitting unit EU-2 may have a structure in which, starting from near the charge generating layer CGL, the second hole controller HL-2, the second light emitter EML-2, and the second electron controller EL-2 are laminated in sequence. In the embodiment illustrated in FIG. 3, the first electrode 101 or the second electrode 102 may be the cathode, which is the electrode that supplies electrons.

In the embodiments in FIGS. 3 to 4, the hole controller HL-1 and HL-2 may be excluded from the first light emitting unit EU-1 or the second light emitting unit EU-2, and starting from the side adjacent to the first electrode 101, the first light emitting unit EU-1 may be provided to include the first electron controller EL-1 and the first light emitter EML-1, or be provided to further include the first hole controller HL-1. The second light emitting unit EU-2 may be provided to include the second light emitter EML-2 disposed on the charge generating layer CGL and the second electron controller EL-2 disposed on the second light emitter, or be provided to further include the second hole controller HL-2 disposed between the charge generating layer CGL and the second light emitter EML-2.

The charge generating layer CGL may perform the role of transporting the holes or electrons to the light emitting unit EU-1 and EU-2 disposed on both of the sides. For example, in the embodiment in FIG. 3, the charge generating layer CGL may perform the function of supplying holes to the light emitting unit EU-1 and EU-2 on both of the sides.

In the embodiment in FIG. 3, in the interface between the p-type layer PL and the hole transport layers HTL-1 and HTL-2 of the charge generating layer CGL, a separation of the electrons and holes may occur due to, for example, the difference in the energy level. For example, when the first electrode 101 has a higher voltage than the second electrode 102, current may flow in the forward direction from the first electrode 101 to the second electrode 102, and in the charge generating layer CGL, the holes may be provided to the side of the second light emitting unit EU-2.

When the forward bias is applied, in the charge generating layer CGL, the p-type layer PL, which is the third organic layer, may have a higher voltage level than the hole transport layer HTL-2, which is the second organic layer disposed adjacent to the second light emitting unit EU-2. A separation of the electrons and holes may occur in the interface between the p-type layer PL and the hole transport layer HTL-2, which is the second organic layer, and the holes may be transported to the second light emitting unit EU-2.

When the forward bias is applied, the hole transport layer HTL-1 may have the higher voltage level between the hole transport layer HTL-1 that corresponds to the first organic layer, and the p-type layer PL, in the interface between the p-type layer PL and the hole transport layer HTL-1, which is the first organic layer, the separation effect of the holes and electrons may not occur, and the transporting of the holes to the side of the first light emitting unit EU-1 may not occur. When the forward bias is applied from the first electrode 101 toward the second electrode 102, the second light emitting unit EU-2 may operate, and the first light emitting unit EU-2 may not operate.

When the reverse bias is applied in which the current flows from the second electrode 102 toward the first electrode 101, due to, for example, the same above-described mechanism, the first light emitting unit EU-1 may operate and the second light emitting unit EU-2 may not operate. For example, when the second electrode 102 has a higher voltage level than the first electrode 101, the current may flow from the second electrode 102 toward the first electrode 101, and in the charge generating layer CGL, a charge may be supplied to the side of the first light emitting unit EU-1.

When the reverse bias is applied, the p-type layer PL, which is the middle layer in the charge generating layer CGL, may have a higher voltage level than the hole transport layer HTL-1 that corresponds to the first organic layer. In the interface between the hole transport layer HTL-1, which is the first organic layer, and the p-type layer PL, a separation of the electrons and holes may occur, and the holes may be transported to the first light emitting unit EU-1. The hole transport layer HTL-2 may have the higher voltage level between the hole transport layer HTL-2 that corresponds to the second organic layer, and the p-type layer PL, and in the interface between the hole transport layer HTL-2, which is the second organic layer, and the p-type layer PL, a separation effect of the holes and electrons may not occur. The transport of the holes to the side of the second light emitting unit EU-2 may not occur, and when the reverse bias is applied from the second electrode 102 to the first electrode 101, the first light emitting unit EU-1 may operate, and the second light emitting unit EU-2 may not operate.

When each of the first light emitting unit EU-1 and the second light emitting unit EU-2 have light emitters that emit light in different wavelength ranges from each other, color conversion may be performed in one of the organic light emitting diodes according to the direction of the applied bias.

FIG. 4 illustrates a cross-sectional view of the organic light emitting diode according to an embodiment that, with respect to the embodiment in FIG. 3, further includes the p-type layer PL-2 as a fourth organic layer and the n-type layer NL as a fifth organic layer in the charge generating layer CGL.

The charge generating layer CGL in FIG. 4 includes the n-type layer NL, which is the fifth organic layer, as the middle layer, and each of the p-type layer PL-1 and PL-2 and the hole transport layer HTL-1 and HTL-2 may be disposed so as to be symmetrical on both of the sides with respect to the fifth organic layer. For example, the charge generating layer CGL may have a structure in which, starting from near the first light emitting unit EU-1, the hole transport layer HTL-1 that corresponds to the first organic layer, the p-type layer PL-1 that corresponds to the third organic layer, the n-type layer NL that corresponds to the fifth organic layer, the p-type layer PL-2 that corresponds to the fourth organic layer, and the hole transport layer HTL-2 that corresponds to the second organic layer are laminated in sequence.

The n-type layer NL, as described above in the description of FIG. 2, may include at least one host material and at least one n-type dopant. For example, one of lithium carbonate ($Li_2CO_3$), lithium quinolate (Liq), lithium azide ($LiN_3$), rubidium carbonate ($Rb_2CO_3$), silver nitrate ($AgNO_3$), barium nitrate ($Ba(NO_3)_2$), manganese nitrate ($Mn(NO_3)_2$), zinc nitrate ($Zn(NO_3)_2$), cesium nitrate ($CsNO_3$), cesium carbonate ($Cs_2CO_3$), cesium fluoride (CsF), or cesium azide ($CsN_3$) may be used as the n-type dopant.

The n-type layer NL included in the charge generating layer CGL may allow the electrons separated in the interface between the p-type layers PL-1 and PL-2 and the hole transport layers HTL-1 and HTL-2 to be easily discharged to the outside of the light emitting diode. For example, in the embodiment in FIG. 4, the electrons separated due to, for example, a separation effect of the electrons and holes in the interface between the p-type layers PL-1 and PL-2 and the hole transport layers HTL-1 and HTL-2 in the charge generating layer CGL, may, without contributing to the operation of the first light emitting unit EU-1 or the second light emitting unit EU-2, remain in the light emitting diode to shorten the lifetime of the diode, and by further including the n-type layer NL in the charge generating layer CGL, the electrons generated in the charge generating layer CGL may be effectively transported to the outside of the light emitting diode.

In the light emitting diode according to the embodiments in FIGS. 3 and 4, the charge generating layer CGL may be included between the first light emitting unit EU-1 and the second light emitting unit EU-2 such that the first light emitting unit EU-1 or the second light emitting unit EU-2 may be selectively operated according to the direction in which the bias is applied.

When the charge generating layer CGL in the embodiments in FIGS. 3 and 4 has a symmetrical structure of the hole transport layer HTL-1/p-type layer PL/hole transport layer HTL-2, or hole transport layer HTL-1/p-type layer PL-1/n-type layer NL/p-type layer PL-2/hole transport layer HTL-2, any one of the light emitting units may be selectively operated according to the direction in which the bias is applied. For example, when the first light emitting unit EU-1 and the second light emitting unit EU-2 have light emitters that emit light in different wavelength ranges from each other, color conversion may be easily performed in one of the light emitting diodes.

In the embodiments in FIGS. 1 to 4, the first light emitting unit EU-1 and the second light emitting unit EU-2 may be configured to have lamination structures that are symmetrical on both of the sides with respect to the charge generating layer CGL.

The following Example is provided in order to highlight characteristics of one or more embodiments, but it will be understood that the organic light emitting diode described in the Example is not to be construed as limiting the scope of the embodiments. Further, it will be understood that the embodiments are not limited to the particular details of the organic light emitting diode described in the Example.

EXAMPLE

Hereinafter, detailed description is given of an Example of a fabrication method for an organic light emitting diode that has the lamination structure illustrated in FIG. 2, and of the characteristics of the organic light emitting diode provided through the fabrication method according to the Example.

<Fabrication of Organic Light Emitting Diode>

Indium tin oxide (ITO) was deposited as a first electrode. A first light emitting unit was formed on the ITO electrode by laminating in the following sequence. Poly(3,4-ethylene-dioxythiophene)/poly(4-styrenesulfonate) (PEDOT/PSS) was formed as a hole injector, and 4,4'-cyclohexylidene bis[n,n-bis(4-methylphenyl)benzenamine] (TAPC) was formed as a hole transporter. As a first light emitter, two of layers doped with a green dopant were formed. Specifically, a layer in which a 4,4',4"-tris(n-carbazolyl)triphenylamine (TCTA) host is doped with a iridium, tris[2-(2-pyridinyl-κN)phenyl-κC] ($Ir(ppy)_3$) green dopant and a layer in which a 4,4',n,n'-dicarbazole-biphenyl (CBP) host is doped with the iridium, tris[2-(2-pyridinyl-κN)phenyl-κC] ($Ir(ppy)_3$) green dopant were formed. As a first electron controller, an electron transport layer was formed on the first light emitter using 1,3,5-tri(1-phenyl-1h-benzo[d]imidazol-2-yl)phenyl (TPBI).

A charge generating layer was formed on the first light emitting unit. The charge generating layer was formed by laminating, in sequence, an n-type layer in which a 2,9-dimethyl-4,7-diphenyl-1,10-phenanthroline (BCP) host is doped with lithium nitride ($Li_3N$), and an n-type layer in which a molybdenum(VI) oxide ($MoO_3$), TAPC, $MoO_3$, BCP host is doped with $Li_3N$.

A second light emitting unit was formed on the charge generating layer. The second light emitting unit used TPBi as the electron controller, and a CBP host doped with Fac-tris(2-phenyl)-bis(2-(2'-benzothienyl)-pyridinatoN,C') (acetylacetonate)Ir(III) ($Bt_2Ir(acac)$) dopant as a second light emitter. TCTA as the hole transporter and $MoO_3$ as the hole injector were formed through deposition. As a second electrode, silver (Ag) was deposited on the second light emitting unit.

<Evaluation of Organic Light Emitting Diode>

With respect to the organic light emitting diode according to an embodiment that was fabricated through the above-described method, a Keithley 236 source measure unit and a CS2000 spectrometer were used to verify the operation and the light emitting properties of the organic light emitting diode.

Figure 5:
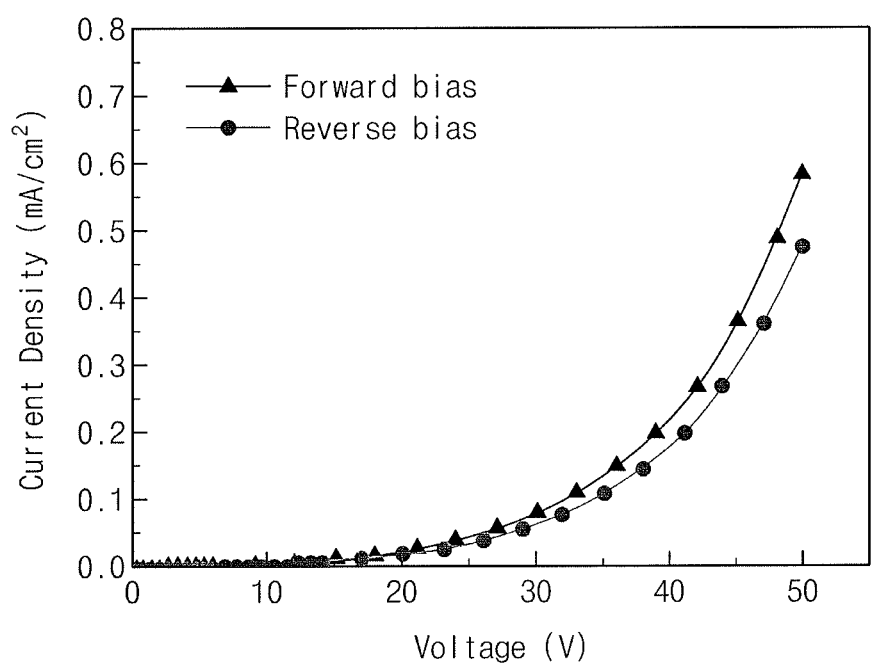
FIG. 5 illustrates a graph of the current density according to the applied voltage in an organic light emitting diode according to an embodiment.
Figure 6:
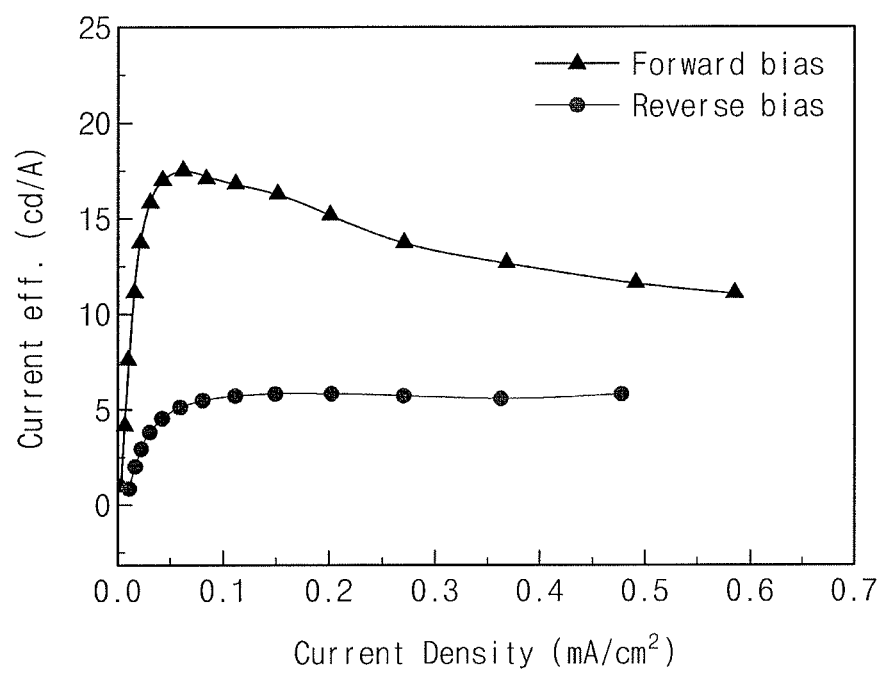
FIG. 6 illustrates a graph of the current efficiency of an organic light emitting diode according to an embodiment.

FIG. 5 illustrates a graph, in the organic light emitting diode according to an embodiment, of the current density according to the applied voltage when a forward bias was applied, and when a reverse bias was applied. FIG. 6 illustrates a graph of the current efficiency according to the current density in the organic light emitting diode according to an embodiment. Referring to the results in FIGS. 5 and 6, the light emitting diode operated, both when the forward bias was applied, and when the reverse bias was applied.

Figure 7:
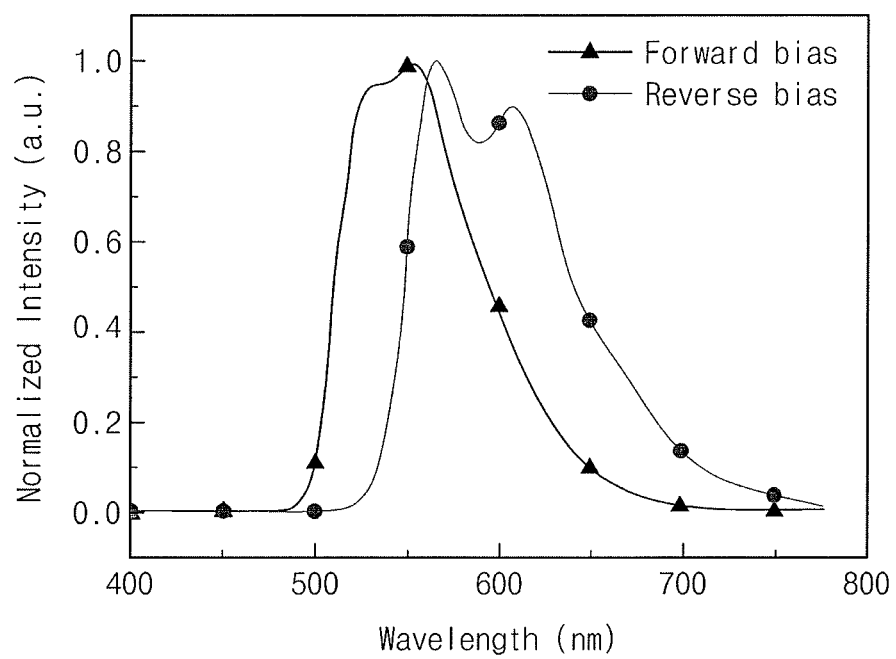
FIG. 7 illustrates a graph of the emission spectrum of an organic light emitting diode according to an embodiment.
Figure 8:
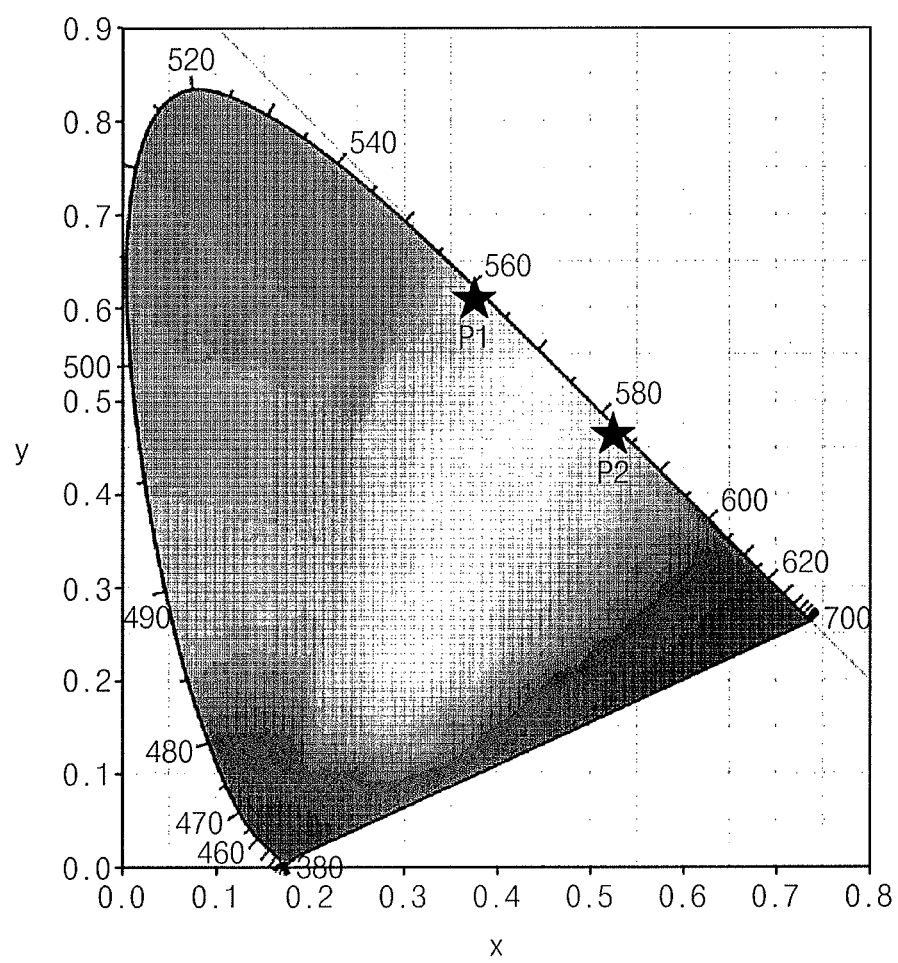
FIG. 8 illustrates a drawing of the color coordinates of an organic light emitting diode according to an embodiment.

FIG. 7 illustrates the emission spectrum of light emitted from the organic light emitting diode when a forward bias is applied, and when a reverse bias is applied, to the organic light emitting diode according to an embodiment. FIG. 8 illustrates the color coordinates of the light emitted from the organic light emitting diode when the forward and reverse biases are applied.

Referring to FIG. 7, the emission peak had a maximum value at about 500 nm to about 600 nm when a forward bias was applied, and the first light emitting unit that emitted a green light was operated. The emission peak moved more toward a longer wavelength when a reverse bias was applied than when a forward bias was applied. The emission peak exhibited a maximum value at about 580 nm to about 650 nm when the second light emitting unit was operated.

FIG. 8 illustrates the color coordinates for the light respectively emitted when a forward bias was applied and when a reverse bias was applied. P1 is the color coordinate point for light emitted when a forward bias was applied and had the coordinate values of (0.387, 0.590), and was verified to emit a green light. P2 is the color coordinate point for light emitted when a reverse bias was applied and had the coordinate values of (0.533, 0.465), and was verified to emit an orange-red light.

By way of summation and review, an organic light emitting diode may include an anode, and a hole transport layer, a light emitting layer, an electron transport layer, and a cathode that may be disposed on the anode in sequence. The hole transport layer, the light emitting layer, and the electron transport layer may be organic thin films including, e.g., consisting of, organic compounds. A structure configured to include a plurality of light emitting layers in an organic light emitting diode is disclosed. When the plurality of light emitting layers are laminated in a single diode, only a single color of light may be emitted, and it may be difficult to convert the color in the single diode.

The present disclosure may provide an organic light emitting diode that includes a plurality of light emitting units to enable color conversion in a single diode.

In the organic light emitting diode according to an embodiment, the plurality of light emitting units may be included in a single light emitting diode, and the charge generating layer may be disposed between the plurality of light emitting units such that one of the light emitting units among the plurality of light emitting units may operate according to the direction in which bias is applied, and color conversion may be possible when the light emitter is configured such that the wavelength ranges of the light emitted from the plurality of light emitting units are different.

By disposing the charge generating layer, which may supply electrons or holes to each of the light emitting units, between the laminated light emitting units, the organic light emitting diode according to an embodiment may change the direction in which bias is applied, and an easy, e.g., a relatively easier, color conversion in a single diode may be enabled.

An organic light emitting diode according to an embodiment may provide a lamination structure of a charge generating layer that enables a charge to be emitted to light emitting units respectively disposed on each side of the charge generating layer, and one of the laminated light emitting units may be selectively operated in accordance to the direction of a bias applied to the organic light emitting diode.

The organic light emitting diode may be provided in which color may be converted in a single diode by selectively operating the light emitting unit.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode, comprising:
   a first electrode;
   a first light emitting unit on the first electrode;
   a charge generating layer on the first light emitting unit, the charge generating layer including a plurality of organic layers;
   a second light emitting unit on the charge generating layer; and
   a second electrode on the second light emitting unit,
   the plurality of organic layers of the charge generating layer including:
   a first organic layer and a second organic layer that are respectively adjacent to the first light emitting unit and the second light emitting unit; and
   a third organic layer between the first organic layer and the second organic layer,
   the first organic layer and the second organic layer both being one of a p-type layer or a hole transport layer, and the third organic layer being the other of the p-type layer or the hole transport layer,
   wherein:
   the first light emitting unit includes a first hole controller on the first electrode, a first light emitter on the first hole controller, and a first electron controller on the first light emitter such that the first hole controller is between the first light emitter and the first electrode; and
   the second light emitting unit includes a second electron controller on the charge generating layer, a second light emitter on the second electron controller, and a second hole controller on the second light emitter such that the second hole controller is between the second light emitter and the second electrode.

2. The organic light emitting diode as claimed in claim 1, wherein:
the first organic layer and the second organic layer are both p-type layers, and
the third organic layer is the hole transport layer.

3. The organic light emitting diode as claimed in claim 2, wherein:
the charge generating layer further includes one or more n-type layers, and
the one or more n-type layers are between the first organic layer and the first light emitting unit, or between the second organic layer and the second light emitting unit.

4. The organic light emitting diode as claimed in claim 1, wherein the first hole controller or the second hole controller includes a hole transporter and a hole injector.

5. The organic light emitting diode as claimed in claim 4, wherein the hole transport layer and the hole transporter include a same hole transport material.

6. The organic light emitting diode as claimed in claim 1, wherein the first light emitter and the second light emitter emit light have different wavelengths from each other.

7. The organic light emitting diode as claimed in claim 6, wherein one or more of the first light emitter or the second light emitter includes a plurality of light emitting layers.

8. The organic light emitting diode as claimed in claim 1, wherein:
the first organic layer and the second organic layer are both hole transport layers, and
the third organic layer is the p-type layer.

9. The organic light emitting diode as claimed in claim 8, wherein the charge generating layer further includes a fourth organic layer which is the p-type layer, and a fifth organic layer which is an n-type layer.

10. The organic light emitting diode as claimed in claim 9, wherein:
the fifth organic layer is a middle layer of the charge generating layer;
the third organic layer is between the fifth organic layer and the first organic layer; and
the fourth organic layer is between the fifth organic layer and the second organic layer.

11. The organic light emitting diode as claimed in claim 8, wherein the second hole controller is between the charge generating layer and the second light emitter.

12. The organic light emitting diode as claimed in claim 11, wherein the first hole controller and the second hole controller are hole transporters.

13. The organic light emitting diode as claimed in claim 8, wherein the first light emitter and the second light emitter emit light having different wavelengths from each other.

14. The organic light emitting diode as claimed in claim 1, wherein:
the p-type layer includes a transition metal oxide, and
the transition metal oxide is one or more of vanadium(V) oxide ($V_2O_5$), tungsten(VI) oxide ($WO_3$); molybdenum (VI) oxide ($MoO_3$), rhenium(VI) oxide ($ReO_3$), iron (II,III) oxide ($Fe_3O_4$), manganese(IV) oxide ($MnO_2$), cobalt(IV) oxide ($CoO_2$), or titanium(IV) oxide ($TiO_2$).

15. The organic light emitting diode as claimed in claim 1, wherein:
a first bias is applied to the first electrode, and a second bias which is different from the first bias is applied to the second electrode; and
one of the first light emitting unit or the second light emitting unit emits light.

16. The organic light emitting diode as claimed in claim 1, wherein one of the first electrode or the second electrode is a reflective electrode.

17. The organic light emitting diode as claimed in claim 1, wherein the first electrode and the second electrode are transparent electrodes or semi-transparent electrodes.

* * * * *